(12) United States Patent
Lim et al.

(10) Patent No.: US 7,608,880 B2
(45) Date of Patent: Oct. 27, 2009

(54) SEMICONDUCTOR MEMORY DEVICE HAVING A PERIPHERAL REGION INCLUDING OPERATING CAPACITORS

(75) Inventors: Bo-Tak Lim, Yongin-si (KR); Su-Yeon Kim, Suwon-si (KR); Jong-Pil Son, Yongin-si (KR); Gong-Heum Han, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 75 days.

(21) Appl. No.: 11/326,159

(22) Filed: Jan. 5, 2006

(65) Prior Publication Data

US 2006/0157737 A1 Jul. 20, 2006

(30) Foreign Application Priority Data

Jan. 18, 2005 (KR) .................... 10-2005-0004435

(51) Int. Cl.
*H01L 27/108* (2006.01)
(52) U.S. Cl. ............... 257/300; 257/532; 257/E27.033; 257/E27.097
(58) Field of Classification Search .............. 257/300, 257/532, E27.033, E27.097, E21.434, E21.444, 257/E21.453; 438/183
See application file for complete search history.

(56) References Cited

U.S. PATENT DOCUMENTS

| | | | | |
|---|---|---|---|---|
| 5,969,420 A * | 10/1999 | Kuge et al. | | 257/758 |
| 6,635,935 B2 * | 10/2003 | Makino | | 257/369 |
| 6,777,751 B2 * | 8/2004 | Yamaoka | | 257/347 |
| 2002/0003270 A1 * | 1/2002 | Makino | | 257/390 |
| 2002/0130345 A1 * | 9/2002 | Saigoh et al. | | 257/300 |
| 2003/0099144 A1 * | 5/2003 | Kim et al. | | 365/210 |
| 2004/0108539 A1 * | 6/2004 | Kim | | 257/314 |
| 2005/0280031 A1 * | 12/2005 | Yano | | 257/202 |

FOREIGN PATENT DOCUMENTS

JP 02298068 A * 12/1990

* cited by examiner

*Primary Examiner*—Sue Purvis
*Assistant Examiner*—Christopher M Roland
(74) *Attorney, Agent, or Firm*—F. Chau & Assoc., LLC

(57) ABSTRACT

A semiconductor memory device comprises a cell region including a plurality of unit memory cells, and a peripheral circuit region, the peripheral circuit region including a plurality of peripheral circuit devices for operating the plurality of memory cells and at least one operating capacitor formed adjacent to at least one peripheral circuit device at a pseudo circuit pattern region.

7 Claims, 3 Drawing Sheets

SEMICONDUCTOR MEMORY DEVICE HAVING A PERIPHERAL REGION INCLUDING OPERATING CAPACITORS

CROSS-REFERENCE TO RELATED APPLICATION

This application claims priority to Korean Patent Application No. 2005-4435, filed on Jan. 18, 2005, the disclosure of which is incorporated herein in its entirety by reference.

TECHNICAL FIELD

The present disclosure relates to a semiconductor memory device, and more particularly, to a semiconductor memory device having a peripheral region including operating capacitors.

BACKGROUND

In, for example, a device using Ultra Large Scale Integration (ULSI) technology and a Dynamic Random Access Memory (DRAM) using a short channel Metal Oxide Semiconductor Field Effect Transistor (MOSFET), a leakage current may be increased when a transistor is turned-off due to a short channel effect. In addition, a contact resistance may increase due to a reduced active area, and process imbalance caused by a pattern density difference between regions in which different devices are formed may occur.

A semiconductor memory device can be divided into a cell region including memory cells and a peripheral circuit region including peripheral circuit devices. The peripheral circuit devices are configured for access operations of the memory cells in the cell region.

In a conventional semiconductor memory device, pattern density between the cell region and the peripheral circuit region is substantially different. Even when the pattern density within an area is the same, process imbalance may occur unless the pattern is uniformly distributed. A loading effect is generated through semiconductor device manufacturing processes such as, for example, a photolithography process, an etching process, a chemical mechanical polishing (CMP) process, a deposition process and a cleaning process, due to a pattern density difference between the cell region and the peripheral circuit region.

The loading effect causes etching rates changes due to pattern density difference. For example, in etching a gate line, a loading effect is generated in the peripheral circuit region due to a lower pattern density than in the cell region, thereby generating etching residues. A pattern density difference between the cell region and the peripheral circuit region may cause the occurrence of bridges in a bit line mask in the peripheral region.

A uniform critical dimension (CD) between devices is difficult to obtain due to the loading effect in processes such as photolithography and etching. In other words, a pattern formation deviation becomes large. For example, more than a targeted area can be etched in a peripheral circuit region.

In a conventional technology, a dummy pattern is formed within the peripheral circuit region to minimize the loading effect. A semiconductor memory device including a dummy pattern to minimize the loading effect will be described with reference to FIG. 1. FIG. 1 is a plan view of a conventional peripheral circuit region including devices for operating a memory cell.

Referring to FIG. 1, a peripheral circuit region 10 includes transistors 2 formed on an N-well, dummy patterns 4 to form a uniform pattern density, transistors 12 formed on a P-well and dummy patterns 14. The transistors 2 and 12 are configured to perform an access operation of memory cells in a semiconductor memory device.

The dummy patterns 4 and 14 are pseudo circuit patterns that are not used for an operation of a semiconductor memory device. The dummy patterns 4 and 14 are used to reduce a pattern formation deviation. Thus, the dummy patterns 4 and 14 are formed adjacent to the transistors 2 and 12. The dummy patterns 4 and 14 are provided for a uniform pattern density to reduce a loading effect in processes such as photolithography and etching so that a uniform CD between devices is ensured.

A pattern formation deviation is reduced by forming the dummy patterns 4 and 14. However, a region where transistors are not formed needs to be provided to obtain an efficient signal interface. A Metal Oxide Semiconductor (MOS) capacitor is formed on the region where transistors are not formed to provide a capacitance to prevent a noise signal.

FIG. 2 is a plan view schematically illustrating peripheral circuit regions including a peripheral circuit region 10 of FIG. 1.

With reference to FIG. 2, a region 30 not having transistors is provided to obtain an efficient signal interface between a peripheral circuit region 10 and another peripheral circuit region 20. In the region 30, a plurality of MOS capacitors 32 are formed. The MOS capacitors 32 stabilize a level of voltage in various direct current (DC) circuits to prevent a noise signal. Alternatively, a MOS capacitor is formed on an edge of a chip.

FIG. 3 is a block diagram including the MOS capacitor 32 shown in FIG. 2.

Referring to FIG. 3, a reference voltage generating circuit 51 includes a current mirror circuit unit 50, a reference voltage drive unit 60 connected between a power source voltage VDD and a first node N1, a reference voltage control unit 70 connected between the reference voltage drive unit 60 and a ground voltage VSS, and the MOS capacitor 32 connected between the first node N1 and the ground voltage VSS.

The MOS capacitor 32 of the reference voltage generating circuit 51 stabilizes a reference voltage VREF, i.e., a voltage between the reference voltage drive unit 60 and the reference voltage control unit 70. That is, the MOS capacitor 32 can maintain a desired reference voltage VREF when noise is applied to a power line and the power source voltage VDD becomes unstable.

The MOS capacitor 32 is applied to the reference voltage generating circuit 51 and to other DC circuits having an internal voltage converter (IVC) circuit. Since the MOS capacitor 32 stabilizes a voltage level, a semiconductor memory device can reliably operate.

However, due to high integration, space for a signal interface and the size of a dummy field to form a dummy pattern are reduced as a cell and a chip size become smaller. As a result, the size of the MOS capacitor is also reduced. Thus, a need exists for relocating the MOS capacitors in the semiconductor memory device.

SUMMARY OF THE INVENTION

Embodiments of the present invention provide a semiconductor memory device that stabilizes a power level and reduces noise by compensating a capacitance volume of a MOS capacitor.

According to an embodiment of the present invention, a semiconductor memory device comprises a cell region including a plurality of unit memory cells, and a peripheral circuit region, the peripheral circuit region including a plurality of peripheral circuit devices for operating the plurality of memory cells and at least one operating capacitor formed adjacent to at least one peripheral circuit device.

According to another embodiment of the present invention, a semiconductor memory device comprises a peripheral circuit region comprising a plurality of peripheral circuit devices including first transistors and second transistors and at least one operating capacitor formed adjacent to at least one peripheral circuit device, and a cell region having the plurality of unit memory cells, wherein a pattern density of the peripheral circuit region and a pattern density of the cell region are substantially the same.

According to another embodiment of the present invention, a semiconductor memory device comprises a peripheral circuit region including a first peripheral circuit block including an operating capacitor and a first transistor, wherein the operating capacitor is disposed in a same column with the first transistor, the first transistor having a smaller gate electrode width than a second transistor, and a sum of a width of the operating capacitor and a gate electrode width of the first transistor is less than a gate electrode width of the second transistor, and a second peripheral circuit block including an operating capacitor disposed opposite a plurality of first transistors successively formed in the same row, wherein a length of the operating capacitor is substantially equal to the sum of all gate electrode lengths of the plurality of first transistors and lengths between gate electrodes of the plurality of first transistors, and a sum of a width of the operating capacitor and a gate electrode width of one of the plurality of first transistors is less than a gate electrode width of the second transistor.

BRIEF DESCRIPTION OF THE DRAWINGS

Preferred embodiments of the present invention can be understood in more detail from the following description taken in conjunction with the accompanying drawings in which.

DETAILED DESCRIPTION OF PREFERRED EMBODIMENTS

Exemplary embodiments of the present invention are more fully described below with reference to the accompanying drawings. The present invention may, however, be embodied in many different forms and should not be construed as being limited to the exemplary embodiments set forth herein.

Figure 1:
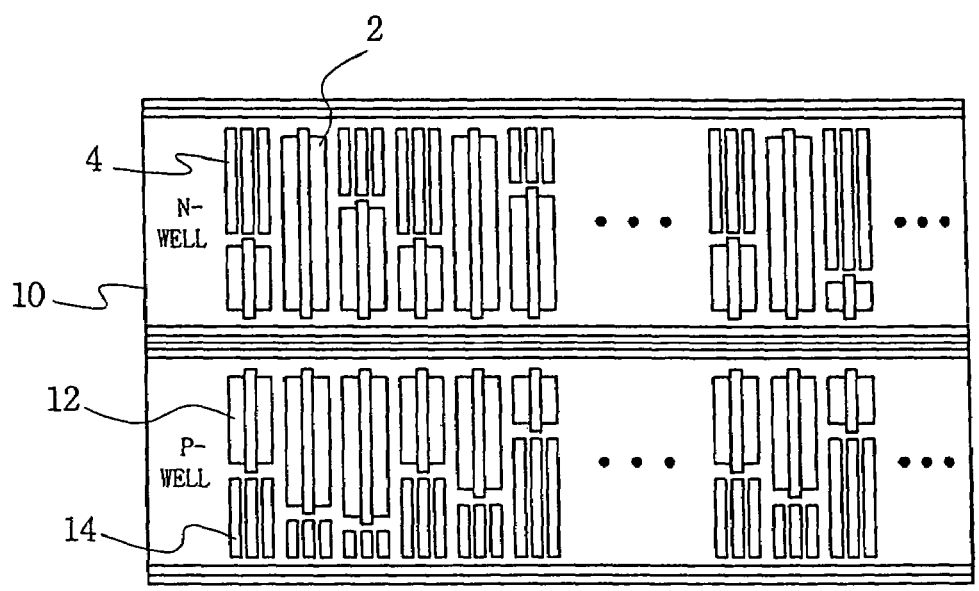
FIG. 1 is a plan view illustrating a conventional peripheral circuit region for a semiconductor memory device.
Figure 2:
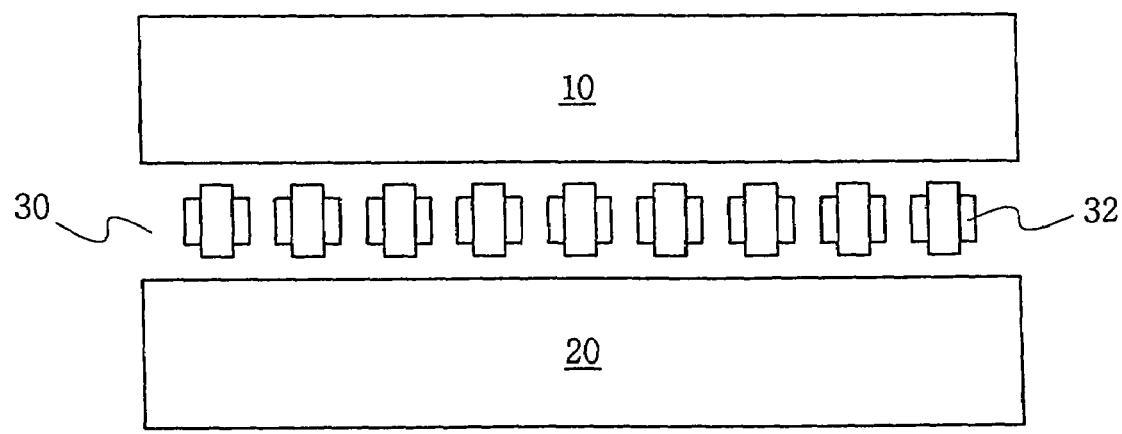
FIG. 2 is a plan view schematically illustrating conventional peripheral circuit regions including the peripheral circuit region shown in FIG. 1.
Figure 3:
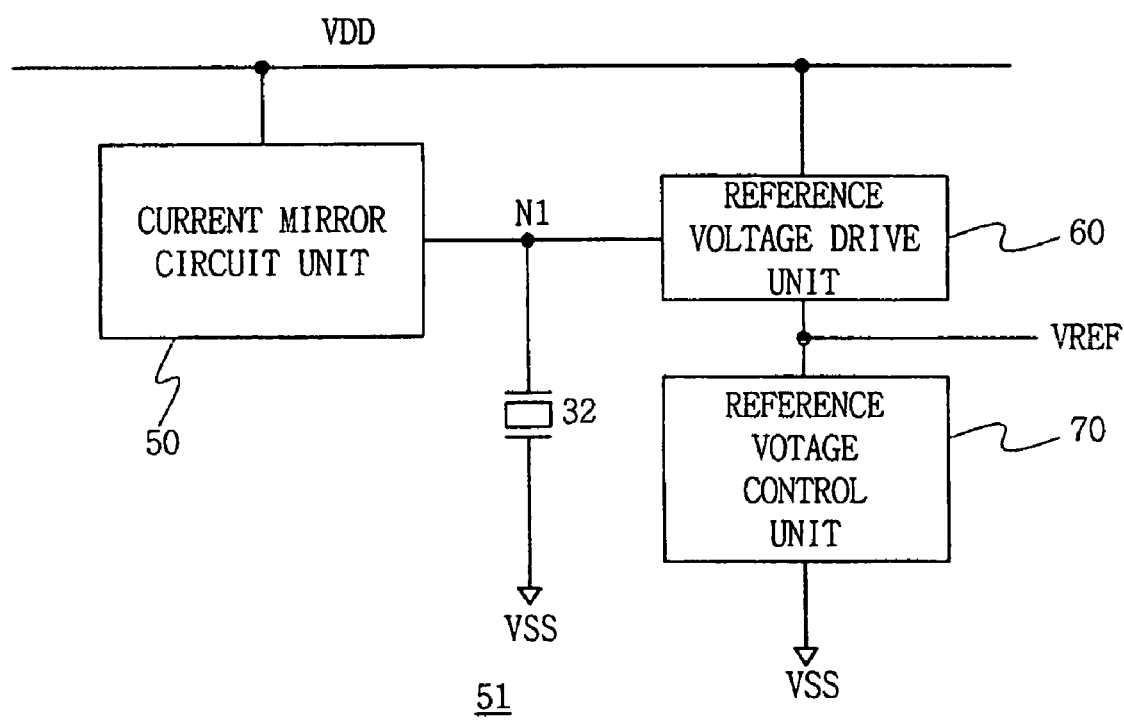
FIG. 3 is a block diagram illustrating a conventional reference voltage generating circuit including a MOS capacitor shown in FIG. 2.
Figure 4:
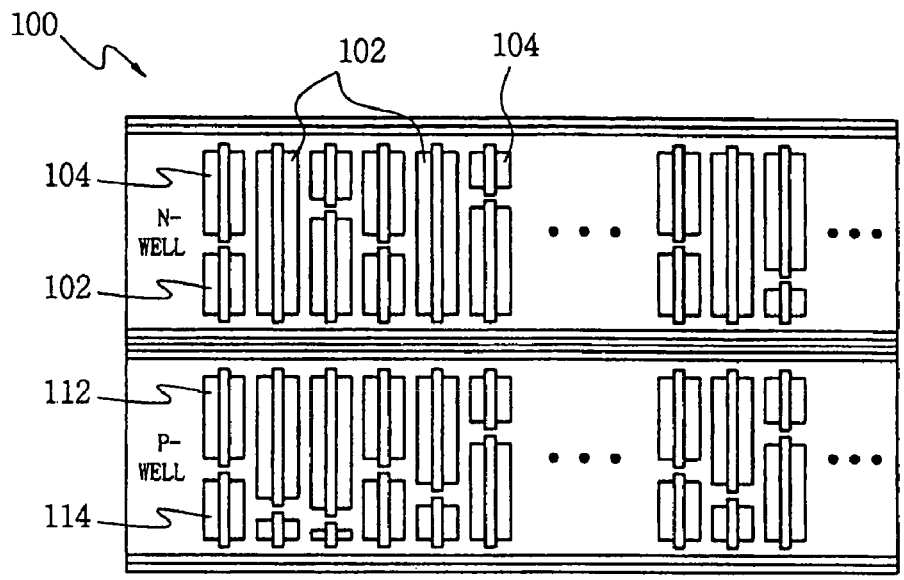
FIG. 4 is a plan view illustrating a peripheral circuit region of a semiconductor memory device including operating capacitors according to an embodiment of the present invention.

FIG. 4 is a plan view illustrating a unit peripheral circuit region 100 including operating capacitors 104, 114 of a semiconductor memory device according to an embodiment of the present invention.

Referring to FIG. 4, the peripheral circuit region 100 includes peripheral circuit devices 102, 112 and the operating capacitors 104, 114.

A semiconductor memory device according to an embodiment of the present invention includes a cell region (not shown) and the peripheral circuit region 100. The cell region includes unit memory cells connected with one another through each intersection of a plurality of rows and columns, thereby forming a matrix. The peripheral circuit region 100 includes the peripheral circuit devices 102, 112 for performing an access operation of the memory cells. On the peripheral circuit region 100, operating capacitors 104, 114 for performing a circuit operation are formed. In an embodiment of the present invention, a pseudo circuit pattern is not formed in the peripheral circuit region 100. The operating capacitors 104, 114 are formed at a region where a dummy pattern as the pseudo circuit pattern would be formed. In a conventional technology, a dummy pattern is used to reduce a pattern formation deviation caused by, for example, a pattern density difference between the peripheral region and the cell region. The operating capacitors 104, 114 are formed in place of the pseudo circuit patterns. The operating capacitors 104, 114 are used to stabilize a voltage level and prevent noise. The operating capacitors 104 can be, for example, MOS capacitors.

The peripheral circuit devices 102, 112 include elements used for an access operation of memory cells in a memory cell region. According to an embodiment of the present invention, the peripheral circuit devices 102, 112 include, for example, an N-type MOS transistor or a P-type MOS transistor, and line wires. For example, the peripheral circuit devices 102 formed on an N-well are P-type MOS transistors, and peripheral circuit devices 112 formed on a P-well are N-type MOS transistors.

In embodiments of the present invention, a width of a gate electrode indicates a longitudinal dimension of the gate electrode. A length of the gate electrode indicates a transverse dimension of the gate electrode. A column represents a width/longitudinal direction of the gate electrode and a row represents a length/transverse direction of the gate electrode.

In the peripheral circuit region 100, a plurality of transistors 102 and 112 are formed successively in rows. The transistors 102 and 112 are categorized as either first transistors, which have a variety of gate electrode widths, or the second transistors which have a single gate electrode width that is longer than those of the first transistors. For example, the P-type MOS transistors 102 in the second and fifth columns of the region 100 are "second transistors", and the remaining transistors 102 and 112 of columns 1-6 are "first transistors". Respective lengths of the first transistors can be equal or can vary. For example, in case when two or more first transistors having a relatively narrow gate electrode width are formed successively in row (e.g. transistors 112), successive operating capacitors (e.g., capacitors 114) can be divided to preserve uniformity between the columns of the successive transistors. When two first transistors are formed in a row, two operating capacitors 104 or 114 can be opposite the two first transistors.

The operating capacitors 104, 114 can be used to prevent noise signals and to stabilize the circuit. Further, as the operating capacitors 104, 114 are formed on the peripheral circuit region 100 having a pattern density lower than that of the memory cell region, a loading effect can be reduced, for example, in a photolithography process or in an etching process. Thus a uniform CD among devices can be ensured. When the operating capacitors 104 are MOS capacitors and formed on an N-well, a drain electrode and a source electrode are connected to supply the power source voltage VDD. A gate electrode is connected to a ground voltage VSS. The gate electrode is a first pole plate of the operating capacitors 104, and the drain electrode and the source electrode are a second pole plate. When the MOS capacitors are the operating capacitors 114 and are formed on a P-well, a drain electrode and a source electrode are coupled and, then connected to a ground voltage VSS. A gate electrode can be formed in such a way that the power source voltage VDD is supplied. In an embodiment of the present invention, the gate electrode is a first pole plate of the operating capacitors 114, and the drain electrode and the source electrode are connected and can be a second pole plate. The polarities of the first pole plate and the second pole plate are opposite.

In the peripheral circuit region 100 of a semiconductor memory device according to an embodiment of the present invention, the operating capacitors 104 are formed to have dimensions in the column direction that are substantially equal to those of the first transistors having a relatively narrow gate electrode width when compared with a second transistor having a widest gate electrode width.

The sum of the gate electrode widths of the operating capacitors 104, 114 and the gate electrode width of a first transistor in the same column is shorter than a gate electrode width of a second transistor.

According to an embodiment of the present invention, when the operating capacitors 104, 114 provide sufficient capacitance required in a circuit operation of the semiconductor memory device, a portion of the dummy pattern can be formed on the peripheral circuit region 100 in addition to the operating capacitors 104, 114.

Figure 5:
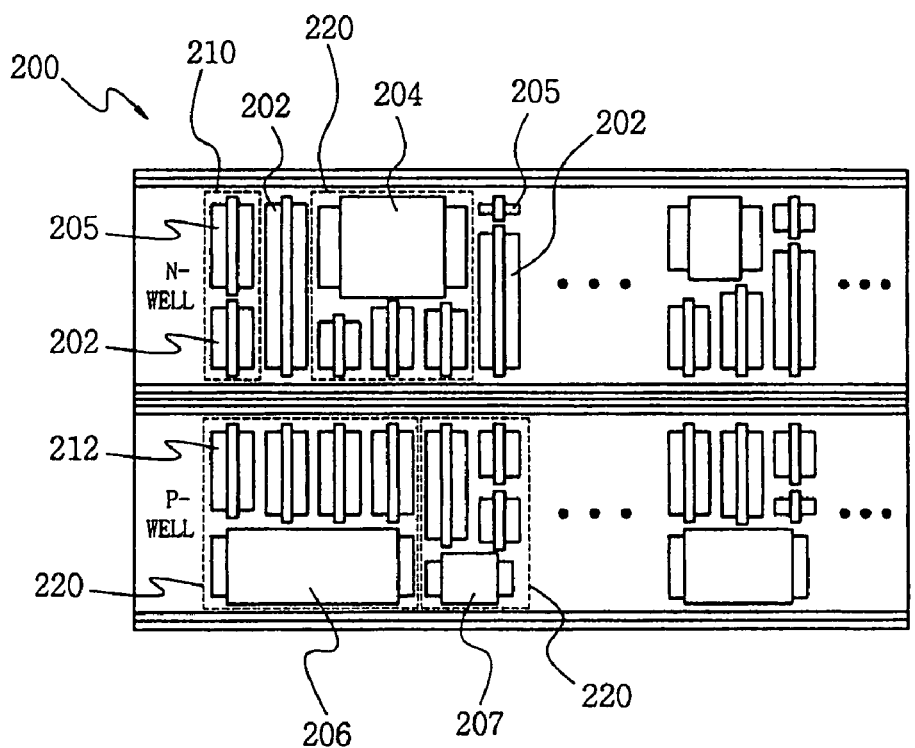
FIG. 5 is a plan view illustrating a peripheral circuit region of a semiconductor memory device including operating capacitors according to another embodiment of the present invention.

FIG. 5 is a plan view illustrating a peripheral circuit region including operating capacitors 204, 205, 206 and 207 in a semiconductor memory device according to another embodiment of the present invention.

Referring to FIG. 5, a peripheral circuit region 200 includes peripheral circuit devices 202, 212 and the operating capacitors 204, 205, 206 and 207.

The operating capacitors 204, 205, 206 and 207 provide capacitance to prevent noise signals and stabilize the circuits. The operating capacitors 204, 205, 206 and 207 are formed on the peripheral circuit region 200 having a circuit pattern density lower than that of the memory cell region. Thus a pattern density difference between the memory cell region and the peripheral circuit region 200 is reduced so that a loading effect can be reduced in processes such as, for example, a photolithography process and an etching process. A uniform CD among devices can be achieved due to the minimized pattern density difference between the memory cell region and the peripheral circuit region 200.

The peripheral circuit devices 202, 212 may include various elements such as, for example, an N-type MOS transistor, a P-type MOS transistor, and line wires used for an access to memory cells of the semiconductor memory device. According to an embodiment of the present invention, the peripheral circuit devices 202, 212 are transistors. The operating capacitors 204, 205, 206 and 207 may be MOS capacitors. The peripheral circuit devices 202 on an N-well are P-type MOS transistors, and the peripheral circuit devices 212 on a P-well are N-type MOS transistors.

The transistors 202, 212 are each divided into first transistors and second transistors. The first transistors have a smaller gate electrode width when compared with the second transistors, which have the widest gate electrode width among the transistors 202, 212. An operating capacitor having a gate electrode whose length is longer than a gate electrode length of the transistors 202, 212 (i.e., spanning more than one column), can be formed on a region opposite to where transistors are formed.

The gate electrode length of the operating capacitor can be formed to be substantially equal to the sum of all gate electrode lengths of the first transistors and lengths between gate electrodes of the first transistors opposite thereto. For example, when two first-transistors 212 are formed successively in a row, a length of the operating capacitors 207 is formed to be substantially equal to the sum of all corresponding gate electrode lengths of the respective first transistors and distances between the gate electrodes in a row direction of the first transistors 212 opposite thereto.

When the first transistors 202 are formed successively in a row, a gate electrode length of the operating capacitor 204 is formed wide enough to be substantially equal to the sum of all gate electrode lengths of the first transistors and distances between the first transistors 202 opposite thereto. The operating capacitor 204 with wider length can provide more capacitance. Capacitance is proportional to an area of electrode plate, and is in inverse proportion to a distance between both electrode plates, thus a greater capacitance can be provided.

In FIG. 5, in an embodiment of the present invention, operating capacitor 204 is formed opposite to three successively disposed first transistors 202. The operating capacitor 206 is formed opposite to four successively disposed first transistors 212. The operating capacitor 207 is formed opposite to two successively disposed first transistors 212. The operating capacitor 205 is formed opposite to a single first transistor 202.

A semiconductor memory device according to an exemplary embodiment of the invention can include a first peripheral circuit block 210 and a second peripheral circuit block 220.

In the first peripheral circuit block 210, peripheral circuit devices 202, 212 such as MOS transistors are formed. The operating capacitor 205 disposed in the same column with a first transistor 202. As stated above, a transistor defined as a first transistor has a smaller gate electrode width when compared with a transistor defined as second transistor which has the widest gate electrode width among the transistors. The sum of a width of the operating capacitor 205 and a gate electrode width of the first transistor202 is shorter than a gate electrode width of the second transistor.

In the second peripheral circuit block 220, where two or more first transistors are formed successively in a row, a length of an operating capacitor is substantially equal to the sum of gate electrode lengths of the first transistors and distances between gate electrodes of the first transistors opposite thereto. The sum of a width of the operating capacitor 206 or 207 and a gate electrode width of the first transistors opposite thereto is shorter than a gate electrode width of a second transistor.

In the second peripheral circuit block 220, when two or more first transistors are formed successively in row, a length of the operating capacitor 204, 206, 207 is substantially equal to the sum of gate electrode lengths of the first transistors and lengths between gate electrodes of the first transistors opposite thereto.

The peripheral circuit region 100, 200 according to an embodiment of the present invention may include more than one of each type of the peripheral circuit blocks 210, 220.

According to embodiments of the present invention, a voltage level can be stabilized in a DC circuit, e.g., an internal voltage converter circuit and a reference voltage generating circuit by forming operating capacitors on the peripheral circuit region in place of pseudo circuit patterns. A sufficient capacitance from capacitors can be ensured, and the semiconductor memory device operates under a more stabilized condition.

A pattern density between regions in a semiconductor memory device becomes uniform, thereby reducing a loading effect in processes, for example, photolithography and etching to ensure a uniform CD.

Although preferred embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A semiconductor memory device, comprising:
   a peripheral circuit region comprising a plurality of peripheral circuit devices including first transistors and second transistors and at least one operating capacitor formed adjacent to at least one peripheral circuit device; and
   a cell region having the plurality of unit memory cells,
   wherein a pattern density of the peripheral circuit region and a pattern density of the cell region are substantially the same without using a dummy pattern in the peripheral circuit region.

2. The semiconductor memory device of claim 1, wherein the at least one operating capacitor is formed at a pseudo circuit pattern region.

3. The semiconductor memory device of claim 1, wherein the at least one operating capacitor is a metal oxide semiconductor capacitor of which a gate electrode is a first pole plate, and a drain electrode and a source electrode are a second pole plate.

4. The semiconductor memory device of claim 1, wherein the first transistors have a variety of gate electrode widths and the second transistors have a gate electrode width that is larger than any of the variety of gate electrode widths of the first transistors.

5. The semiconductor memory device of claim 4, wherein a sum of a gate electrode width of the at least one operating capacitor disposed in a same column of the first transistor and a gate electrode width of the first transistor is less than a gate electrode width of a the second transistor.

6. The semiconductor memory device of claim 1, wherein the peripheral circuit devices are N-type MOS transistors or P-type MOS transistors.

7. The semiconductor memory device of claim 4, wherein a gate electrode length of the at least one operating capacitor disposed opposite the first transistors successively formed in the same row is substantially equal to the sum of gate electrode lengths of the first transistors and distances between gate electrodes of the first transistors.

\* \* \* \* \*